(12) United States Patent
Wang

(10) Patent No.: US 10,180,608 B2
(45) Date of Patent: Jan. 15, 2019

(54) ARRAY SUBSTRATE AND LIQUID CRYSTAL DISPLAY APPARATUS HAVING THE SAME

(71) Applicant: WUHAN CHINA STAR OPTOELECTRONICS TECHNOLOGY CO., LTD., Wuhan, Hubei (CN)

(72) Inventor: Cong Wang, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 138 days.

(21) Appl. No.: 15/122,933

(22) PCT Filed: May 17, 2016

(86) PCT No.: PCT/CN2016/082284
§ 371 (c)(1),
(2) Date: Sep. 1, 2016

(87) PCT Pub. No.: WO2017/185428
PCT Pub. Date: Nov. 2, 2017

(65) Prior Publication Data
US 2018/0149933 A1  May 31, 2018

(30) Foreign Application Priority Data

Apr. 29, 2016  (CN) .......................... 2016 1 0281287

(51) Int. Cl.
*H01L 29/00* (2006.01)
*G02F 1/1362* (2006.01)
(Continued)

(52) U.S. Cl.
CPC ...... *G02F 1/136209* (2013.01); *G02F 1/1368* (2013.01); *G02F 1/134363* (2013.01);
(Continued)

(58) Field of Classification Search
None
See application file for complete search history.

(56) References Cited

U.S. PATENT DOCUMENTS 6,320,204 B1 * 11/2001 Hirabayashi .......... G02F 1/1368
257/296
2007/0159565 A1 * 7/2007 Segawa ............. G02F 1/136209
349/38

(Continued)

FOREIGN PATENT DOCUMENTS

CN  102569187 A  7/2012
CN  103474437 A  12/2013
(Continued)

*Primary Examiner* — Kevin M Picardat
(74) *Attorney, Agent, or Firm* — Soroker Agmon Nordman

(57) ABSTRACT

An array substrate and a liquid crystal display apparatus are disclosed. The array substrate includes: a glass substrate; a light-shielding metallic layer mounted having a first region and a second region; a first insulating layer; a thin-film transistor; a pixel electrode layer; a common electrode layer electrically connected to the light-shielding metallic layer. A storage capacitor is formed between the second region and a drain electrode of the thin-film transistor. The array substrate has an advantage of increasing the storage capacitance of liquid crystal display apparatus and therefore enhancing display performance.

5 Claims, 2 Drawing Sheets

(51) Int. Cl.
*H01L 27/12* (2006.01)
*G02F 1/1343* (2006.01)
*G02F 1/1368* (2006.01)
*H01L 29/417* (2006.01)

(52) U.S. Cl.
CPC ........ *G02F 1/136213* (2013.01); *H01L 27/12* (2013.01); *G02F 1/136227* (2013.01); *G02F 2001/13685* (2013.01); *H01L 27/1255* (2013.01); *H01L 29/41733* (2013.01)

(56) References Cited

U.S. PATENT DOCUMENTS

| | | | |
|---|---|---|---|
| 2008/0198284 A1* | 8/2008 | Oyamada | G02F 1/136213 349/39 |
| 2011/0309397 A1* | 12/2011 | Cheng | G02F 1/136209 257/98 |
| 2014/0054592 A1* | 2/2014 | Gu | G02F 1/134363 257/71 |
| 2016/0126258 A1 | 5/2016 | Liu et al. | |
| 2016/0172387 A1 | 6/2016 | Wang et al. | |
| 2016/0197096 A1 | 7/2016 | Sun et al. | |

FOREIGN PATENT DOCUMENTS

| | | |
|---|---|---|
| CN | 104485333 A | 4/2015 |
| CN | 104538399 A | 4/2015 |
| CN | 105336751 A | 2/2016 |

\* cited by examiner

ARRAY SUBSTRATE AND LIQUID CRYSTAL DISPLAY APPARATUS HAVING THE SAME

BACKGROUND OF THE INVENTION

Field of the Invention

The present invention relates to the technical field of liquid crystal display, and more particularly to an array substrate and a liquid crystal display apparatus having the same.

Description of the Related Art

The traditional structural design of pixels of an LTPS panel usually uses a top and a bottom ITO films to form storage capacitance Cst therebetween so as to enhance stability of the panel.

In the actual panel design, since the size of a pixel is relatively small, the storage capacitance in the panel is generally small; particularly when the PPI (pixel per inch) gets higher, the storage capacitance formed in the panel will become smaller, thereby affecting the stability of the panel where crosstalk or flickering may easily occur in the panel and then affect display performance of the panel.

Therefore, the conventional technology has its shortcoming and is in urgent need of improvement.

SUMMARY OF THE INVENTION

An objective of the present invention is to provide an array substrate and a liquid crystal display apparatus having the same so as to solve the technical problem where a conventional array substrate has small storage capacitance and thereby affecting its display performance.

In order to solve the foregoing problem, the technical solutions of the present invention are as follows:

an array substrate, including:

a glass substrate;

a light-shielding metallic layer mounted on the glass substrate, and the light-shielding layer has a first region and a second region;

a first insulating layer mounted on the glass substrate and the light-shielding metallic layer;

a thin-film transistor mounted on the first insulating layer, and the thin-film transistor has a source electrode, a drain electrode, a gate electrode and a semiconductor layer;

a pixel electrode layer electrically connected to the drain electrode;

a common electrode layer electrically connected to the light-shielding metallic layer, wherein a first storage capacitor is formed between the pixel electrode layer and the common electrode layer;

the first region of the light-shielding metallic layer is used to block light; the second region of the light-shielding layer directly faces the drain electrode so as to form a second storage capacitor between the second region of the light-shielding layer and the drain electrode.

In the array substrate of the present invention, a flattening layer is mounted on the thin-film transistor; the common electrode layer is mounted on the flattening layer; a third insulating layer is mounted on the common electrode layer; the pixel electrode layer is mounted on the third insulating layer.

In the array substrate of the present invention, the thin-film transistor further includes a second insulating layer and an interlayer dielectric layer; the semiconductor layer is mounted on the first insulating layer; the second insulating layer is mounted on the semiconductor layer; the gate electrode is mounted on the second insulating layer; the interlayer dielectric layer is mounted on the second insulating layer and the gate electrode; the source electrode and the drain electrode are mounted on the interlayer dielectric layer; the flattening layer is disposed on the source electrode, the drain electrode and the interlayer dielectric layer.

In the array substrate of the present invention, the source electrode is in contact with the semiconductor layer by extending through a first through hole of the interlayer dielectric layer and a first through hole of the second insulating layer; the drain electrode is in contact with the semiconductor layer by extending through a second through hole of the interlayer dielectric layer and a second through hole of the second insulating layer.

In the array substrate of the present invention, a second metallic layer is mounted on the second insulating layer; the second metallic layer has a source region, a drain region and a connection region which are insulated from each other;

the source electrode is mounted on the source region of the second metallic layer; the drain electrode is mounted on the drain region of the second metallic layer; the flattening layer has a fourth through hole; the common electrode is in contact With and electrically connected to the connection region of the second metallic layer through the fourth through hole; the connection region of the second metallic layer is electrically connected to the light-shielding metallic layer.

In the array substrate of the present invention, the second insulating layer and the first insulating layer are sequentially penetrated to form a third through hole therethrough; the connection region of the second metallic layer is in contact with and electrically connected to the light-shielding metallic layer through the third through hole.

In the array substrate of the present invention, the thin-film transistor further includes a second insulating layer and an interlayer dielectric layer; the semiconductor layer is mounted on the first insulating layer; the source electrode is mounted on the first insulating layer and the semiconductor layer; the drain electrode is mounted on the first insulating layer and the semiconductor layer the second insulating layer is mounted on the source electrode, the drain electrode, the semiconductor layer and the first insulating layer; the gate electrode is mounted on the second insulating layer; the interlayer dielectric layer is mounted on the gate electrode and the second insulating layer; the flattening layer is mounted on the interlayer dielectric layer.

In the array substrate of the present invention a second metallic layer is mounted on the first insulating layer and the semiconductor layer; the second metallic layer has a source region, a drain region and a connection region which are insulated from each other; the source electrode is mounted on the source region of the second metallic layer; the drain electrode is mounted on the drain region of the second metallic layer; the flattening layer, the interlayer dielectric layer and the second insulating layer are sequentially penetrated to form a fifth through hole; the common electrode is in contact with and electrically connected to the connection region of the second metallic layer through the fifth through hole; the connection region of the second metallic layer is electrically connected to the light-shielding metallic layer.

In the array substrate of the present invention, a third through hole is formed through the first insulating layer; the connection region of the second metallic layer is in contact with and electrically connected to the light-shielding metallic layer through the third through hole.

The present invention further provides a liquid crystal display apparatus which has the aforementioned array substrate.

Compared with conventional technology, in the present invention, the common electrode layer is electrically connected to the light-shielding metallic layer; therefore the light-shielding metallic layer has the same electric potential as the common electrode layer. The pixel electrode layer is electrically connected to the drain electrode and therefore has the same electric potential as the drain electrode. A second storage capacitor is then formed at a position where the second region of the light-shielding metallic layer directly faces the drain electrode. The storage capacitance of the array substrate is increased by the second storage capacitor, thereby enhancing the display performance and not affecting aperture ratio.

DETAILED DESCRIPTION OF THE PREFERRED EMBODIMENTS

Figure 1:
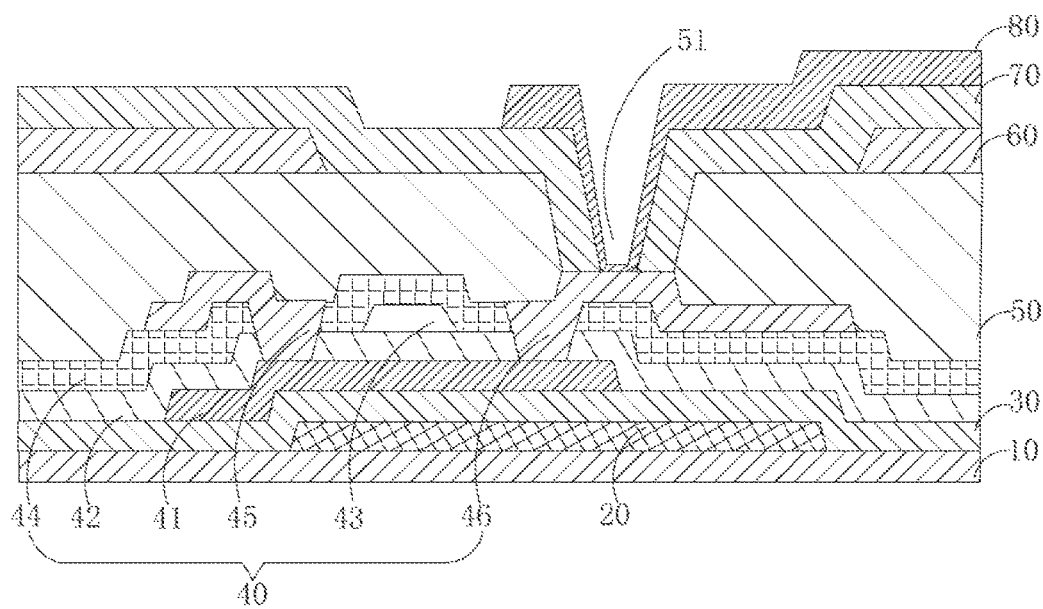
FIG. 1 is a schematic structural view of an array substrate according to a first preferred embodiment of the present invention.

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

In the drawings, similar structural units are designated by the same reference numerals.

With reference to FIG. 1, FIG. 1 is a schematic structural view of an array substrate according to a first preferred embodiment of the present invention. The array substrate of the preferred embodiment comprises: a glass substrate 10, a light-shielding metallic layer 20, a first insulating layer 30, a thin-film transistor 40, a flattening layer 50, a common electrode layer 60, a third insulating layer 70 and a pixel electrode layer 80, wherein the thin-film transistor 40 includes a semiconductor layer 41, a second insulating layer 42, a gate electrode 43, an interlayer dielectric layer 44, a source electrode 45 and a drain electrode 46.

The light-shielding metallic layer 20 is mounted on the glass substrate 10. The light-shielding metallic layer 20 has a first region (not marked) and a second region (not marked); wherein the first region corresponds in position to the semiconductor layer 41 and is mainly used to block light. The second region corresponds to and directly laces the drain electrode 46 and is mainly used to form a second storage capacitor with the drain electrode 46.

The first insulating layer 30 is mounted on the glass substrate 10 and the light-shielding metallic layer 20. The first insulating layer 30 is made of silicon nitride and/or silicon oxide by chemical vapor deposition.

The thin-film transistor 40 is mounted on the first insulating layer 30. Specifically, the semiconductor layer 41 is mounted on the first insulating layer 30. The second insulating layer 42 is mounted on the semiconductor layer 41. The gate electrode 43 is mounted on the second insulating layer 42. The interlayer dielectric layer 44 is mounted on the second insulating layer 42 and the gate electrode 43. The source electrode 45 and the drain electrode 46 are mounted on the interlayer dielectric layer 44. The source electrode 45 is in contact with the semiconductor layer 41 by sequentially extending through a first through hole of the interlayer dielectric layer 44 and a first through hole of the second insulating layer 42. The drain electrode 46 is in contact with the semiconductor layer 41 by extending through a second through hole of the interlayer dielectric layer 44 and a second through hole of the second insulating layer 42.

The flattening layer 50 is mounted on the source electrode 45, the drain electrode 46 and the interlayer dielectric layer 44. The common electrode layer 60 is mounted on the flattening layer 50. The third insulating layer 70 is mounted on the common electrode layer 60. The pixel electrode layer 80 is mounted on the third insulating layer 70. The flattening layer 50 and the third insulating layer 70 are provided with a drain-electrode through hole 51 formed through the flattening layer 50 and the third insulating layer 70. The pixel electrode layer 80 is in contact with and electrically connected to the drain electrode 46 through the drain-electrode through hole 51.

Figure 2:
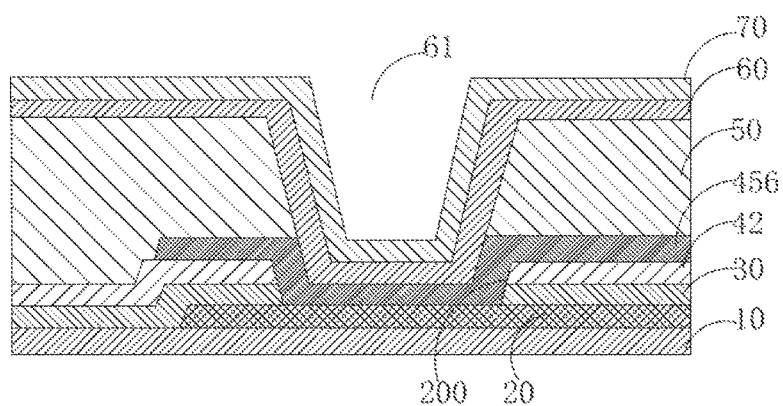
FIG. 2 is a schematic partial structural view of the array substrate shown in FIG. 1 viewing from another angle.

Specifically, with further reference to FIG. 2, the array substrate further includes a second metallic layer (not marked) being mounted on the second insulating layer 42, wherein the second metallic layer has a source region, a drain region and a connection region 456 which are insulated from each other. The source electrode 45 is mounted on source region of the second metallic layer. The drain electrode 46 is mounted on the drain region of the second metallic layer. The flattening layer 50 is provided with a fourth through hole 61. The common electrode layer 60 is in contact with and electrically connected to the connection region 456 of the second metallic layer through the fourth through hole 61. The connection region 456 of the second metallic layer is electrically connected to the light-shielding metallic layer 20. The second insulating layer 42 and the first insulating layer 30 are provided with a third through hole 200 formed through the second insulating layer 42 and the first insulating layer 30. The connection region 456 of the second metallic layer is in contact with and electrically connected to the light-shielding metallic layer 20 through the third through hole 200.

A first storage capacitor is formed between the common electrode layer 60 and the pixel electrode layer 80. Since the common electrode layer 60 is electrically connected to the light-shielding metallic layer 20 the light-shielding metallic layer 20 has the same electrical potential as the common electrode layer 60. The pixel electrode layer 80 and the drain electrode 46 are electrically connected, whereby the pixel electrode layer 80 and the drain electrode 46 have the same electrical potential. The second region of the light-shielding metallic layer 20 directly faces the drain electrode 46, thereby forming the second storage capacitor. The storage capacitance of the array substrate is increased by the second storage capacitor; thereby enhancing the display performance and not affecting aperture ratio.

Figure 3:
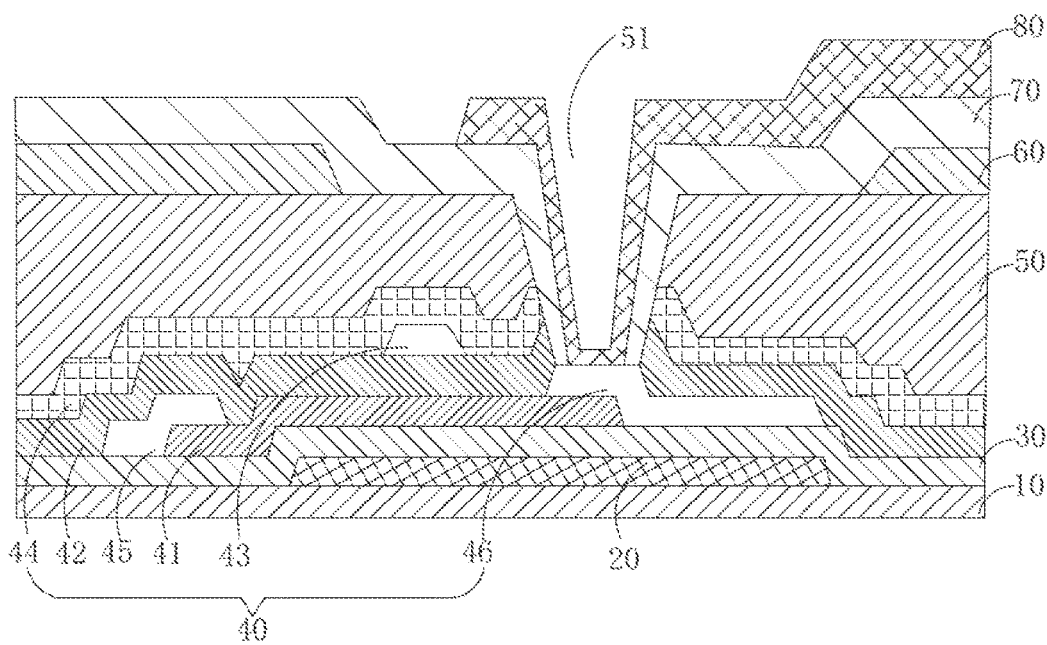
FIG. 3 is a schematic structural view of an array substrate according to a second preferred embodiment of the present invention.

With reference to FIG. 3, FIG. 3 is a schematic structural view of an array substrate according to a second preferred embodiment of the present invention. The array substrate of this preferred embodiment includes: a glass substrate 10, a light-shielding metallic layer 20, a first insulating layer 30, a thin-film transistor 40, a flattening layer 50, a common electrode layer 60, the third insulating layer 70 and a pixel electrode layer 80. The thin-film transistor 40 includes a semiconductor layer 41, a second insulating layer 42, a gate electrode 43, an interlayer dielectric layer 44, a source electrode 45 and a drain electrode 46.

The light-shielding metallic layer 20 is mounted on the glass substrate 10. The light-shielding metallic layer 20 has a first region (not marked) and a second region (not marked), wherein the first region corresponds in position to the semiconductor layer 41 and is mainly used to block light. The second region corresponds to and directly faces the drain electrode 46 and is mainly used to form a second storage capacitor with the drain electrode 46.

The first insulating layer 30 is mounted on the glass substrate 10 and the light-shielding metallic layer 20. The first insulating layer 30 is made of silicon nitride and/or silicon oxide by chemical vapor deposition.

The thin-film transistor 40 is mounted on the first insulating layer 300. Specifically, the semiconductor layer 41 is mounted on the first insulating layer 30. The source electrode 45 is mounted on the first insulating layer 30 and the semiconductor layer 41. The drain electrode 46 is mounted on the first insulating layer 30 and the semiconductor layer 41. The second insulating layer 42 is mounted on the source electrode 4, the chain electrode 46, the semiconductor layer 41 and the first insulating layer 30. The gate electrode 43 is mounted on the second insulating layer 42. The interlayer dielectric layer 44 is mounted on the date electrode 43 and the second insulating layer 42.

The flattening layer 50 is mounted on the interlayer dielectric layer 44. The common electrode layer 60 is mounted on the flattening layer 50. The third insulating layer 70 is mounted on the common electrode layer 60. The pixel electrode layer 80 is mounted on the third insulating layer 70. The third insulating layer 70 and the flattening layer 50 are sequentially penetrated so as to form a chain-electrode through hole 51. The pixel electrode layer 80 is in contact with and electrically connected to the drain electrode 46 through the drain-electrode through hole 51.

Figure 4:
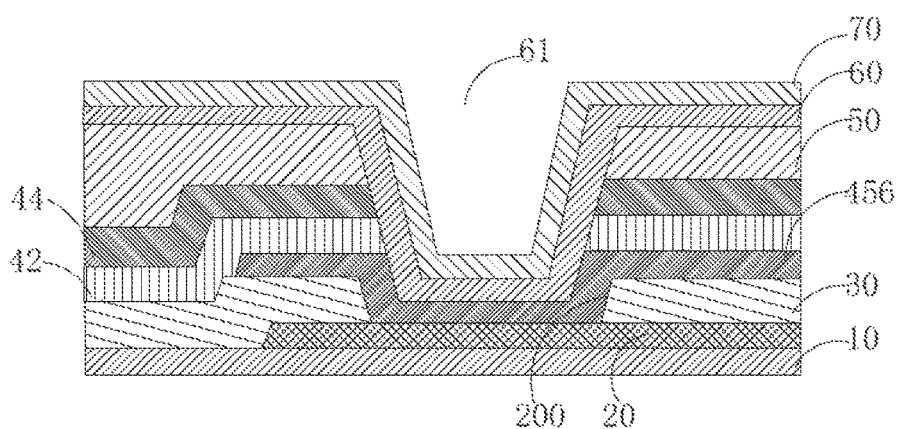
FIG. 4 is a schematic partial structural view of the array substrate shown in FIG. 3 viewing from another angle.

Meanwhile, with reference FIG. 4, in this embodiment, the array substrate specifically further includes a second metallic layer (not marked) being mounted on the first insulating layer 30 and the semiconductor layer 41, wherein the second metallic layer has a source region, a drain region and a connection region 456 which are insulated from each other. The source electrode 45 is mounted on source region of the second metallic layer. The drain electrode 46 is mounted on the drain region of the second metallic layer. The flattening layer 50, the interlayer dielectric layer 44 and the second insulating layer 42 are sequentially penetrated to form a fifth through hole 61. The common electrode layer 60 is in contact with and electrically connected to the connection region 456 of the second metallic layer through the fifth through hole 61. The connection region 456 of the second metallic layer is electrically connected to the light-shielding metallic layer 20. A third through hole 200 is formed through the first insulating layer 30. The connection region 456 of the second metallic layer is in contact with and electrically connected to the light-shielding metallic layer 20 through the third through hole 200.

In this embodiment, since the drain electrode 46 and the source electrode 45 are directly formed on the semiconductor layer 41, the first insulating layer 30 is the only insulating layer between the drain electrode 46 and the second region of the light-shielding metallic layer 20. Thus, compared with the foregoing embodiment, the second storage capacitance formed between the light-shielding metallic layer 20 and the drain electrode 46 is further increased, whereby the storage capacitance of the array substrate can be further increased so as to further enhance display performance.

The present invention further provides a liquid crystal display apparatus which includes the array substrate of any one of the aforementioned embodiments, a liquid crystal layer and a color filter substrate, wherein the liquid crystal layer is disposed between the color filter layer and the array substrate.

In conclusion, although the present invention has been described with reference to the preferred embodiment thereof it is apparent to those skilled in the art that a variety of modifications and changes may be made without departing from the scope of the present invention which is intended to be defined by the appended claims.

What is claimed is:

1. An array substrate, comprising:
   a glass substrate;
   a light-shielding metallic layer mounted on the glass substrate, and the light-shielding layer has a first region and a second region;
   a first insulating layer mounted on the glass substrate and the light-shielding metallic layer;
   a thin-film transistor mounted on the first insulating layer, and the thin-film transistor has a source electrode, a drain electrode, a gate electrode and a semiconductor layer;
   a pixel electrode layer electrically connected to the drain electrode;
   a common electrode layer electrically connected to the light-shielding metallic layer, wherein a first storage capacitor is formed between the pixel electrode layer and the common electrode layer; wherein
   the first region of the light-shielding metallic layer is used to block light; the second region of the light-shielding layer directly faces the drain electrode so as to form a second storage capacitor between the second region of the light-shielding layer and the drain electrode; wherein
   a flattening layer is mounted on the thin-film transistor; the common electrode layer is mounted on the flattening layer; a third insulating layer is mounted on the common electrode layer; the pixel electrode layer is mounted on the third insulating layer; wherein
   the thin-film transistor further includes a second insulating layer and an interlayer dielectric layer; the semiconductor layer is mounted on the first insulating layer; the source electrode is mounted on the first insulating layer and the semiconductor layer; the drain electrode is mounted on the first insulating layer and the semiconductor layer; the second insulating layer is mounted on the source electrode, the drain electrode, the semiconductor layer and the first insulating layer; the gate electrode is mounted on the second insulating layer; the interlayer dielectric layer is mounted on the gate electrode and the second insulating layer; the flattening layer is mounted on the interlayer dielectric layer; wherein
   a second metallic layer is mounted on the first insulating layer and the semiconductor layer; the second metallic layer has a source region, a drain region and a connection region which are insulated from each other; the flattening layer, the interlayer dielectric layer and the second insulating layer are sequentially penetrated to form a fifth through hole; the common electrode is in contact with and electrically connected to the connection region of the second metallic layer through the fifth through hole; the connection region of the second metallic layer is electrically connected to the light-shielding metallic layer.

2. The array substrate as claimed in claim 1, herein a third through hole is formed through the first insulating layer; the connection region of the second metallic layer is in contact with and electrically connected to the light-shielding metallic layer through the third through hole.

3. A liquid crystal display apparatus, comprising the array substrate as claimed in claim 1.

4. An array substrate, comprising:
a glass substrate;
a light-shielding metallic layer mounted on the glass substrate, and the light-shielding layer has a first region and a second region;
a first insulating layer mounted on the glass substrate and the light-shielding metallic layer;
a thin-film transistor mounted on the first insulating layer, and the thin-film transistor has a source electrode, a drain electrode, a gate electrode and a semiconductor layer;
a pixel electrode layer electrically connected to the drain electrode;
a common electrode layer electrically connected to the light-shielding metallic layer, wherein a first storage capacitor is formed between the pixel electrode layer and the common electrode layer;
the first region of the light-shielding metallic layer is used to block light; the second region of the light-shielding layer directly faces the drain electrode so as to form a second storage capacitor between the second region of the light-shielding layer and the drain electrode;
a flattening layer is mounted on the thin-film transistor; the common electrode layer is mounted on the flattening layer; a third insulating layer is mounted on the common electrode layer; the pixel electrode layer is mounted on the third insulating layer;
the thin-film transistor further includes a second insulating layer and an interlayer dielectric layer; the semiconductor layer is mounted on the first insulating layer; the second insulating layer is mounted on the semiconductor layer; the gate electrode is mounted on the second insulating layer; the interlayer dielectric layer is mounted on the second insulating layer and the gate electrode; the source electrode and the drain electrode are mounted on the interlayer dielectric layer; the flattening layer is disposed on the source electrode, the drain electrode and the interlayer dielectric layer;
the source electrode is in contact with the semiconductor layer by extending through a first through hole of the interlayer dielectric layer and a first through hole of the second insulating layer; the drain electrode is in contact with the semiconductor layer by extending through a second through hole of the interlayer dielectric layer and a second through hole of the second insulating layer;
a second metallic layer is mounted on the second insulating layer; the second metallic layer has a source region, a drain region and a connection region which are insulated from each other;
the source electrode is mounted on the source region of the second metallic layer; the drain electrode is mounted on the drain region of the second metallic layer; the flattening layer has a fourth through hole; the common electrode is in contact with and electrically connected to the connection region of the second metallic layer through the fourth through hole; the connection region of the second metallic layer is electrically connected to the light-shielding metallic layer;
the second insulating layer and the first insulating layer are sequentially penetrated to form a third through hole therethrough; the connection region of the second metallic layer is in contact with and electrically connected to the light-shielding metallic layer through the third through hole.

5. An array substrate, comprising:
a glass substrate;
a light-shielding metallic layer mounted on the glass substrate, and the light-shielding layer has a first region and a second region;
a first insulating layer mounted on the glass substrate and the light-shielding metallic layer;
a thin-film transistor mounted on the first insulating layer, and the thin-film transistor has a source electrode, a drain electrode, a gate electrode and a semiconductor layer;
a pixel electrode layer electrically connected to the drain electrode;
a common electrode layer electrically connected to the light-shielding metallic layer, wherein a first storage capacitor is formed between the pixel electrode layer and the common electrode layer;
the first region of the light-shielding metallic layer is used to block light; the second region of the light-shielding layer directly faces the drain electrode so as to form a second storage capacitor between the second region of the light-shielding layer and the drain electrode;
a flattening layer is mounted on the thin-film transistor; the common electrode layer is mounted on the flattening layer; a third insulating layer is mounted on the common electrode layer; the pixel electrode layer is mounted on the third insulating layer;
the thin-film transistor further includes a second insulating layer and an interlayer dielectric layer; the semiconductor layer is mounted on the first insulating layer; the second insulating layer is mounted on the semiconductor layer; the gate electrode is mounted on the second insulating layer; the interlayer dielectric layer is mounted on the second insulating layer and the gate electrode; the source electrode and the drain electrode are mounted on the interlayer dielectric layer; the flattening layer is disposed on the source electrode, the drain electrode and the interlayer dielectric layer;
the source electrode is in contact with the semiconductor layer by extending through a first through hole of the interlayer dielectric layer and a first through hole of the second insulating layer; the drain electrode is in contact with the semiconductor layer by extending through a second through hole of the interlayer dielectric layer and a second through hole of the second insulating layer;
a second metallic layer is mounted on the second insulating layer; the second metallic layer has a source region, a drain region and a connection region which are insulated from each other;
the source electrode is mounted on the source region of the second metallic layer; the drain electrode is mounted on the drain region of the second metallic layer; the flattening layer has a fourth through hole; the common electrode is in contact with and electrically connected to the connection region of the second metallic layer through the fourth through hole; the connection region of the second metallic layer is electrically connected to the light-shielding metallic layer.

\* \* \* \* \*